United States Patent
Takeda

(10) Patent No.: US 6,593,526 B2
(45) Date of Patent: Jul. 15, 2003

(54) MOUNTING MECHANISM OF METAL PLATE ON PRINTED BOARD

(75) Inventor: Itaru Takeda, Akita (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 0 days.

(21) Appl. No.: 09/880,368

(22) Filed: Jun. 13, 2001

(65) Prior Publication Data
US 2002/0038723 A1 Apr. 4, 2002

(30) Foreign Application Priority Data
Sep. 29, 2000 (JP) ........................................ 2000-298269

(51) Int. Cl.⁷ ............................................... H01L 23/02
(52) U.S. Cl. ...................... 174/52.1; 361/772; 361/774; 257/692
(58) Field of Search ................................ 174/52.1, 52.2, 174/52.3, 52.4; 361/772, 773, 774; 257/666, 667, 690, 692, 693, 695, 696, 697, 694

(56) References Cited

U.S. PATENT DOCUMENTS 4,991,059 A * 2/1991 Kiyose ........................ 338/329
5,270,492 A * 12/1993 Fukui ......................... 174/52.2
6,169,323 B1 * 1/2001 Sakamoto ................... 257/667

FOREIGN PATENT DOCUMENTS

JP 06005762 A * 1/1994 ........... H01L/23/50
JP 2000294330 A * 10/2000 ........... H01R/12/32

* cited by examiner

Primary Examiner—Dean A. Reichard
Assistant Examiner—Carmelo Oliva
(74) Attorney, Agent, or Firm—Fattibene & Fattibene; Paul A. Fattibene; Arthur T. Fattibene

(57) ABSTRACT

In a mounting mechanism of a metal plate on a printed board housed in a portable telephone or the like, a metal plate connected with a terminal portion of a cell or the like is joined to a land via solder, and a cut-out portion is provided at a joining portion of the metal plate which is joined to the land, and the total length of fillets of the solder between the land and the joining portion is extended by the cut-out portion. Accordingly, the mounting strength of a metal plate mounted to the land disposed on the printed board can be improved.

2 Claims, 4 Drawing Sheets

MOUNTING MECHANISM OF METAL PLATE ON PRINTED BOARD

BACKGROUND OF THE INVENTION

1. Field of the Invention

The present invention relates to a mounting mechanism of a metal plate on a printed board, and in particular to a mounting mechanism of a metal plate on a printed board where mounting strength of a metal plate to be soldered on a land has been improved.

2. Description of the Related Art

One example of a conventional mounting mechanism of a metal plate on such a printed board will be explained with reference to FIGS. 3 and 4.

In these figures, reference numeral 1 denotes a printed board or printed wiring board. A copper foil (hereinafter, referred to as land) 2 is disposed on an surface of the printed board 1, a joining or bonding portion 3a of a strip-shape nickel plate 3 which is narrower than the land 2 is overlapped on an upper face of the land 2, and the nickel plate 3 is soldered to the land 2 through reflow.

Therefore, a front end of the land 2 projects slightly from a front end of the joining portion 3a of the nickel plate 3, so that fillets 4 with a sectional configuration of almost triangle are formed between three sides of the joining portion 3a and a surface of the land 2 due to solder melted and flowed out when the soldering is made through the reflow, as shown in FIG. 4.

In a case that the above conventional mounting mechanism of a metal plate on a printed board is assembled in, for example, a portable or mobile telephone or the like, the mounting mechanism is not only required to be made small and light but also the soldering strength (peel strength) is required to be increased so as to endure the carrying of such a portable device.

However, in the mounting mechanism of a metal plate on the printed board, the area of the land 2 is also reduced according to the requirements of the small sizing and the weight reduction, so that the joining area of the joining portion 3a of the nickel plate 3 is narrowed and reduced necessarily. Therefore, the joining strength between the land 2 and the nickel plate 3 is also lowered.

SUMMARY OF THE INVENTION

A technical problem to be solved occurs in order to achieve a mounting mechanism of a metal plate on a printed board where mounting strength of a metal plate can be enhanced without increasing a outer configuration or area of a land, and an object of the present invention is to solve this problem.

The present invention has been made to solve the above problem. According to a first aspect of the present invention, there is provided a mounting mechanism of a metal plate on a printed board where a metal plate connected with a terminal portion of a cell, part, or the like is joined to a land via solder, wherein a cut-out portion is provide at a joined portion of the metal plate which is joined to the land, and the total length of the fillets of the solder formed between the land and the joining portion is extended by the cut-out portion.

Thus, since the cut-out portion is provided in the joining portion of the metal plate connected to the land, and the total length of a fillet formed between the land and the joining portion is extended by the cut-out portion when the metal plate is soldered to the land, such an excellent effect can be obtained that the mounting strength of the metal plate to the land can be increased without increasing an outer area of the land, and size reduction and manufacturing cost reduction of a printed board can be achieved.

According to a second aspect of the invention, there is provided a mounting mechanism of a metal plate on a printed board according to the first aspect, wherein the cut-out portion provided in the metal plate is formed at a front end portion of the joining portion of the metal plate so as to have a U-shape opened towards a front edge.

DETAILED DESCRIPTION OF THE PREFERRED EMBODIMENTS

Figure 1:
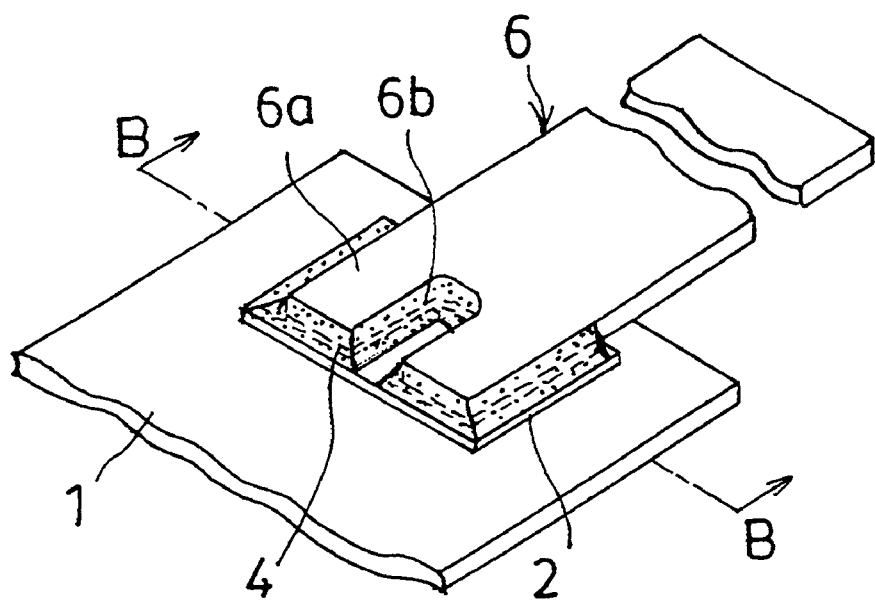
FIG. 1 is a partially broken perspective view of a mounting mechanism of a metal plate showing an embodiment of the present invention.

Embodiments of the present invention will be explained with reference to FIGS. 1 to 2. First of all, the inventions corresponding to the first and second aspects will be explained with reference to FIGS. 1 and 2. Incidentally, for explanation of these embodiments, the same numbers or parts as the conventional example described above are donated by the same reference numerals, and detailed explanation thereof will be omitted In the figures, an almost U-shaped opening 6b which is opened at its front face is provided or bored at a central end portion of a joining portion 6a of a nickel plate 6 which is joined to a land 2 disposed on a printed board 1. That is, the plane figure of the joining portion 6a is formed in an almost recess shape by the opening 6b and the joining portion 6a is divided to left and right portions by the opening 6b.

Figure 2:
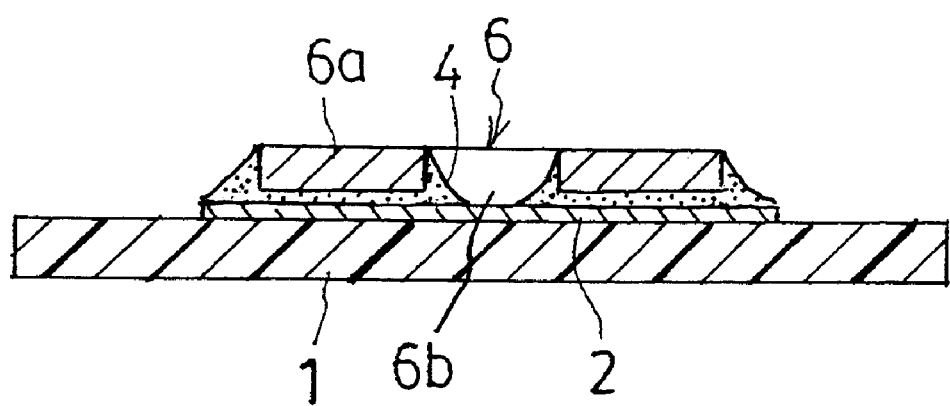
FIG. 2 is a sectional and enlarged view taken along line B—B in FIG. 1.
Figure 3:
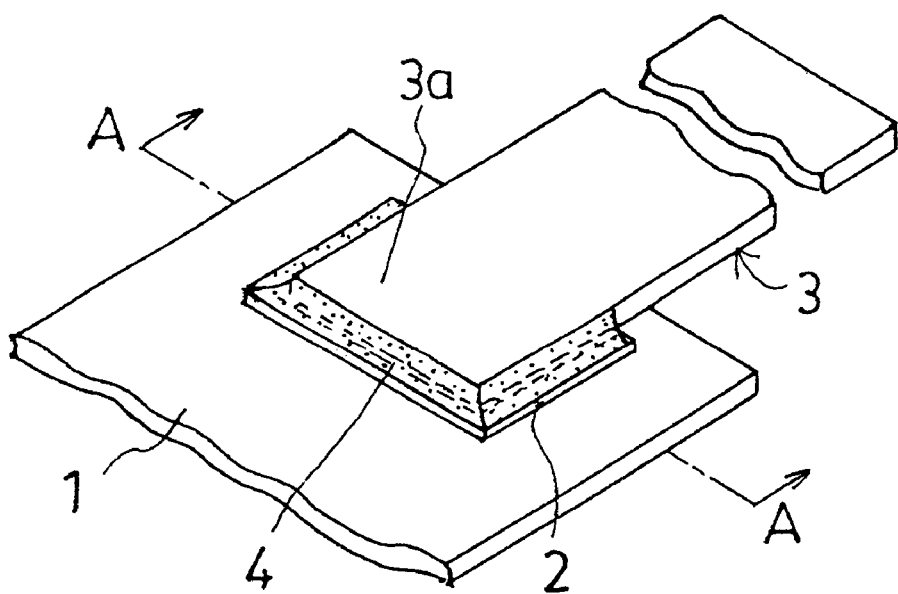
FIG. 3 is a partially broken perspective view of a mounting mechanism of a metal plate showing a conventional example.
Figure 4:
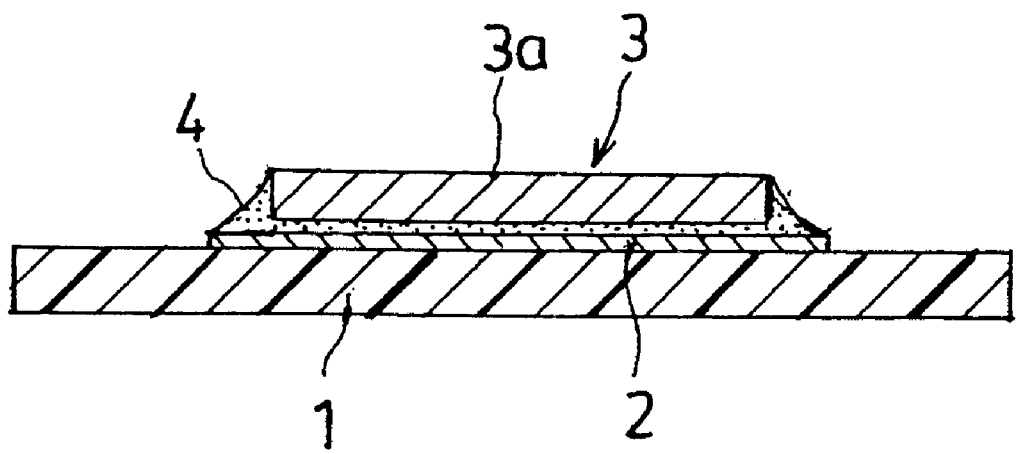
FIG. 4 is a sectional and enlarged view taken along line A—A in FIG. 3.

As shown in FIG. 2, after solder which has been applied to a surface of the land 2 is melted, the solder flows out and hardens, so that fillets 4 of the solder with an almost triangular sectional configuration are formed between an outer periphery or edge of the joining portion 6a and an inner periphery or edge of the opening 6b, and a surface of the land 2. Accordingly, since the fillet 4 formed on the joining portion 6a of the nickel plate 6 is also formed on the inner periphery of the opening 6b, the total length of the formation of the fillet 4 is significantly extended by the length corresponding to the length of the inner periphery. Thus, the mounting strength (peel strength) of the nickel plate 6 to the land 2 is improved.

Also, in the above embodiments, a case that material for a metal plate to be soldered to the land 2 is nickel has been explained, but the present invention is not limited to this case. For example, the metal plate to be soldered may be a nickel-plated metal plate, and it may be other material plates, for example, a copper plate or a copper alloy plate.

Incidentally, the present invention may be modified or changed variously without departing from the spirit or scope of the invention, and, of course, it includes such a modification or change.

What is claimed is:

1. A mounting mechanism of a metal plate on a printed board, where the metal plate connected with a terminal portion of a part is joined to a land via solder, wherein a cut-out portion which has a U-shaped opening towards a front edge at a joining portion of the metal plate which is joined to the land, and right and left widths of said cut-out portion are formed wide, and the total length of fillets of the solder formed between the land and the joining portion is extended by the cut-out portion, in addition, the fillets in said cut-out portion are constructed to be not joined with each other.

2. A mounting mechanism for attaching a plate to a printed wiring board comprising:
   a printed wiring board;
   a land formed on said printed wiring board;
   a plate;
   two joining portions forming a U-shaped opening formed on said plate, the U-shaped opening having a predetermined width between adjacent first and second peripheral edges of said two joining portions;
   a first fillet of solder attaching the first peripheral edge of one of said two joining portions in the U-shaped opening to said land, said first fillet having a first lateral dimension; and
   a second fillet of solder attaching the second peripheral edge of the other one of said two joining portion in the U-shaped opening to said land, said second fillet having a second lateral dimension,
   said first and second lateral dimensions of said first and second fillets having a combined lateral dimension less than the predetermined width so as to prevent contact there between and provide a space between said first and second fillets within the U-shaped opening,
   whereby the mounting strength of said plate to said land is improved.

* * * * *